United States Patent
Washio et al.

(10) Patent No.: US 8,455,058 B2
(45) Date of Patent: Jun. 4, 2013

(54) RESIN COMPOSITION AND COATING METHOD USING THE SAME

(75) Inventors: Yasushi Washio, Kanagawa (JP); Takahiro Senzaki, Kanagawa (JP); Kazuhide Uno, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 478 days.

(21) Appl. No.: 12/453,425

(22) Filed: May 11, 2009

(65) Prior Publication Data
US 2009/0285985 A1    Nov. 19, 2009

(30) Foreign Application Priority Data

May 14, 2008    (JP) .................................. 2008-127116
Nov. 27, 2008   (JP) .................................. 2008-303084

(51) Int. Cl.
*B05D 1/32*      (2006.01)
*B05D 7/00*      (2006.01)
*B05D 7/24*      (2006.01)
*H01J 9/227*     (2006.01)
*H01J 9/233*     (2006.01)

(52) U.S. Cl.
CPC .. *B05D 1/32* (2013.01); *B05D 7/00* (2013.01); *B05D 7/24* (2013.01); *H01J 9/233* (2013.01); *H01J 9/227* (2013.01)
USPC .............................. 427/520; 427/231; 522/55

(58) Field of Classification Search
CPC .... B05D 1/32; B05D 1/327; B05D 7/00; H01J 9/227; H01J 9/2278; H01J 9/233
USPC .......................................... 427/240; 522/55
See application file for complete search history.

(56) References Cited

U.S. PATENT DOCUMENTS 6,204,456 B1    3/2001  Lauffer et al.
6,254,931 B1 *  7/2001  Herpst et al. ................... 427/240
6,461,717 B1   10/2002  Rutter, Jr. et al.

(Continued)

FOREIGN PATENT DOCUMENTS

JP    10-172431    6/1998
JP    10-306124    11/1998

(Continued)

OTHER PUBLICATIONS

Expoxy Resins Product Overview. Dow Chemical Company. 2011.*

(Continued)

*Primary Examiner* — Randy Gulakowski
*Assistant Examiner* — Kara Boyle
(74) *Attorney, Agent, or Firm* — Wenderoth, Lind & Ponack, L.L.P.

(57) ABSTRACT

To provide a resin composition capable of forming a thin film layer so as to cause tenting over concave portions by conventional coating processes without depending on dry films, and also a coating method so as to cause tenting of the resin composition. A resin composition, which, by spin coating, causes tenting over concave portions formed on a substrate, the resin composition including a resin component (a) and a solvent (b) and has a viscosity of at least 200 cP, and tenting can be achieved by using the resin composition, allowing the resin composition to fall drop wise onto a substrate on which concave portions are formed, and spin coating the substrate at a rotating speed of 300 to 4000 rpm.

8 Claims, 1 Drawing Sheet

U.S. PATENT DOCUMENTS

| | | | |
|---|---|---|---|
| 7,875,416 B2 * | 1/2011 | Park et al. | 430/270.1 |
| 2005/0042371 A1 * | 2/2005 | Ushida et al. | 427/240 |
| 2006/0035170 A1 * | 2/2006 | Saito et al. | 430/270.1 |

FOREIGN PATENT DOCUMENTS

| | | |
|---|---|---|
| JP | 2000-188473 | 7/2000 |
| JP | 2001-319851 | 11/2001 |
| JP | 2002-47430 | 2/2002 |
| JP | 2002-299204 | 10/2002 |

OTHER PUBLICATIONS

Notice of Reasons for Rejection issued Feb. 26, 2013 in corresponding Japanese Application No. 2008-303084.

* cited by examiner

RESIN COMPOSITION AND COATING METHOD USING THE SAME

This application is based on and claims the benefit of priority from Japanese Patent Application Nos. 2008-127116 and 2008-303084, respectively filed on 14 May 2008 and 27 Nov. 2008, the contents of which are incorporated herein by reference.

BACKGROUND OF THE INVENTION

1. Field of the Invention

The present invention relates to a resin composition and a coating method using the same.

2. Related Art

When compositions such as those of photosensitive resins are coated on surfaces of semiconductor wafers or glass substrates, rotational coating processes, screen printing coating processes, dipping coating processes, spray coating processes, etc. are typically employed. In all of these processes, the surfaces of semiconductor wafers or glass substrates are coated by a liquid-form coating liquid; therefore, when substrates to be coated have concave portions such as holes (pores) or trenches between wiring, the coating liquid enters into the concave portions, and thus the coating liquid, which has entered into the concave portions, is required to be removed at a subsequent step. When the concave portion is a hole in particular, there is a problem in that photosensitive resin residue remains within the holes since developer is unlikely to enter the hole during the developing step which is conducted after the photosensitive resin has entered the holes. The residue may be removed by increasing development time; however, this approach suffers from a problem in that the entire thickness of the resulting resin layer decreases, i.e. so-called "film reduction" occurs. In order to solve this problem, attempts have been made to form a thin film layer of photosensitive resin composition in which the photosensitive resin composition does not enter into the holes in particular.

A process, referred to as a tenting process, is used to form a thin film layer of photosensitive resin composition on substrates with concave portions. In such a process, tenting refers to the ability of the photosensitive resin composition to cover a substrate and concave portions of the substrate without entering into voids defined by the concave portions. In the tenting process, a photosensitive resin composition is coated and dried onto a release film such as polyester film to form a so-called dry film, and the dry film is laminated onto the surface of substrates by thermal compression etc., then the release film is peeled off. Consequently, a thin film layer of photosensitive resin composition can be easily formed over concave portions (Patent Document 1).

[Patent Document 1] Japanese Unexamined Patent Application, First Publication No. Hei 10-172431

SUMMARY OF THE INVENTION

However, in the process for using the dry film, it is necessary to introduce a thermal compression device in addition to a photosensitive resin composition coating device, thus capital costs are required, and additionally, production costs increase as does the level of complication of the working processes; in view of these reasons, a method is required that is capable of forming a thin film layer so that concave portions undergo tenting by coating a photosensitive resin composition that is easy to handle and can be employed using simple working processes.

In view of such circumstances, it is an object of the present invention to provide a resin composition capable of forming a thin film layer so that concave portions undergo tenting by coating without depending on dry films and also a coating method which causes tenting of the resin composition.

The present inventors have found that the above-mentioned problems can be solved by adjusting the viscosity of coating resin composition and the rotating speed of the substrate during spin coating, thereby achieving the present invention. Specifically, the present invention provides the following.

In a first aspect of the present invention, a resin composition causes tenting over concave portions formed on a substrate by spin coating, and the resin composition contains a resin component (a) and a solvent (b) and has a viscosity of at least 200 cP.

In a second aspect of the present invention, a coating method contains the steps of allowing the above-mentioned resin composition to fall drop wise onto a substrate on which a pattern of concave portions is formed and causing tenting by spin coating at a rotating speed of 300 to 4000 rpm.

In accordance with the present invention, a thin film layer can be formed so that concave portions undergo tenting by spin coating without using dry film.

DETAILED DESCRIPTION OF THE INVENTION

Figure 1:
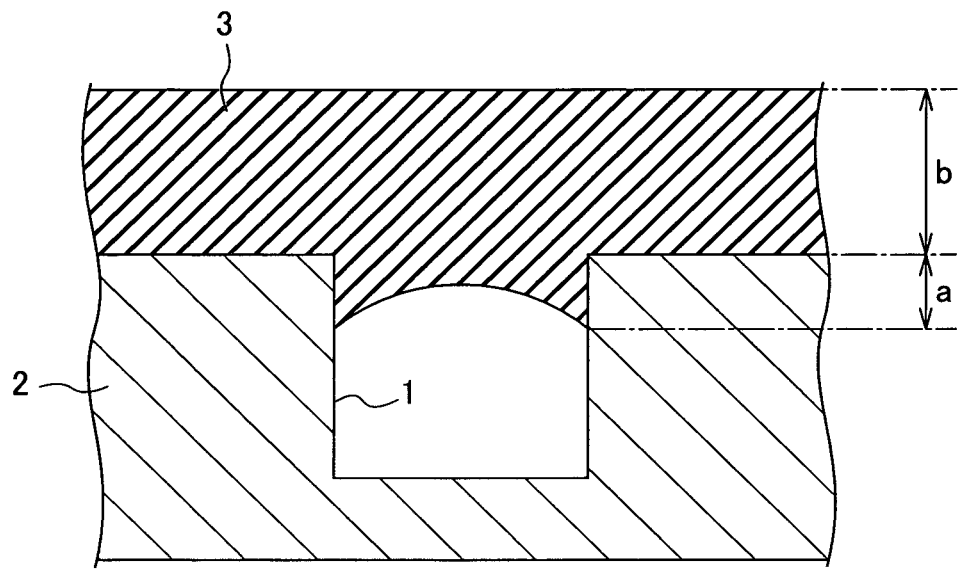
FIG. 1 is a cross-sectional view showing a state of a resin layer formed on a substantially cylindrical hole.

The present invention is explained with respect to embodiments of the present invention below, but the present invention is not limited at all by the embodiments below.

Resin Composition

In a first aspect, the present invention provides a resin composition which causes tenting over concave portions formed on a substrate by spin coating, and the resin composition contains a resin component (a) and a solvent (b) and has a viscosity of at least 200 cP; components thereof are as follows.

Resin Component (a)

The resin component (hereinafter, referred also as "component (a)"), which may be selected depending on application and purpose thereof without particular limitation, is preferably a resin component that may be included into conventional photosensitive resin compositions for a wide variety of applications such as production of semiconductors, etc. Therefore, the resin components included in the photosensitive resin composition are explained below. Examples of the component (a) include resin components that are incorporated into any negative, positive, chemically-amplified, or non-chemically amplified photosensitive resins that have been used for semiconductors, liquid crystals, color filters, etc.

Specific examples thereof include monomers with an ethylenically unsaturated double bond (including dimer, trimer, oligomer); polymers with an ethylenically unsaturated double bond at a side or main chain such as (meth)acrylic acid polymers of acrylic acid, methacrylic acid, etc., (meth)acrylic ester polymers of methyl acrylate, methyl methacrylate, etc., and aromatic vinyl monomers and polymers of m-methyl styrene, p-methoxy styrene, etc.;

novolac resins, which are prepared by a condensation reaction between aromatic hydroxyl compounds and aldehydes or ketones, such as phenol novolac-type epoxy acrylate polymers and cresol novolac-type epoxy methacrylate polymers; and polyhydroxystyrenes and derivatives thereof (polyhydroxystyrene resins). The component (a) may be used alone or in combination of two or more.

Solvent (b)

The solvent (hereinafter, also referred to as "component (b)") is not particularly limited, and any conventional solvent may be used. Examples thereof include cyclohexanone, propylene glycol monomethyl ether acetate (PGMEA), propylene glycol monomethyl ether (PM), 3-methoxybutyl acetate, methoxypropyl acetate, ethyl 3-ethoxypropionate, ethyl acetate, butyl acetate, propyl acetate, pentyl acetate, hexyl acetate, heptyl acetate, octyl acetate, ethyl lactate, butyl lactate, pentyl lactate, hexyl lactate, heptyl lactate, octyl lactate, acetone, methyl isobutyl ketone (MIBK), methyl ethyl ketone (MEK), γ-butyrolactone, 2-heptanone, methanol, ethanol, propanol, butanol, pentanol, hexanol, heptanol, octanol, hexane, heptane, octane, nonane, decane, diethyl ether, cyclohexane, cyclohexanol, dioxane, oxetane, phenol, cresol, xylenol, etc. The component (b) may be used alone or in combination of two or more.

Preferably, the component (b) has a surface tension of 27 to 45 dyn/cm$^2$ at 20° C. under normal atmospheric pressure. Due to the component (b) having such a surface tension, the ability of the resin composition to coat a substrate on which concave portions have been formed, is improved, and further, the uniformity of resulting resin layer may also be improved in addition to improved tenting. Preferable examples of the component (b) include cyclohexanone, propylene glycol monomethyl ether, y-butyrolactone, ethyl lactate, etc. In addition, the surface tension of the solvent may be measured by a drop-type surface tensiometer.

Other Components

The resin composition according to the present invention may contain well-known conventional components in common use such as surfactants and pigments in addition to the above-mentioned components.

Surfactant

The surfactant is not particularly limited, and conventional surfactants may be used. Examples thereof include various anionic, cationic or nonionic surfactants, ampholytic surfactants, and silicone surfactants.

Preferably, the concentration of the surfactant is less than 5000 ppm by mass in the resin composition according to the present invention, particularly preferably 250 to 2000 ppm by mass. When the surfactant is included in the resin composition at the above-mentioned concentration, the ability of the resin composition to coat a substrate during spin coating is improved, and further, the uniformity of resulting resin layer may also be improved When the component (a) is a resin component included in the photosensitive resin composition, well-known conventional components such as photosensitizing agents, monomer components, acid components, and nitrogen-containing organic compounds can be additionally included in the resin composition.

Photosensitizing Agent

The photosensitizing agent is not particularly limited and conventional photosensitizing agents may be used according to those used in photosensitive resin compositions. Examples of the photosensitizing agent include radical polymerization initiators such as 1-hydroxycyclohexyl phenyl ketone; photosensitive substances such as naphthoquinone diazide; and acid generators such as onium salt, oxime sulfonate, diazomethane, nitrobenzyl sulfonate, imino sulfonate, and disulfone compounds.

Method of Preparing Resin Composition

The resin composition according to the present invention can be prepared by mixing the resin component (a) and the solvent (b) to form a uniform solution. Surfactants, photosensitizing agents, etc. may also be added and mixed as required. It is necessary that the viscosity of the resulting resin composition is at least 200 cP; the viscosity is preferably 200 to 3000 cP, more preferably 200 to 2000 cP, still more preferably 200 to 1000 cP, and particularly preferably 400 to 800 cP.

It is generally believed that when a resin composition with a lower viscosity is coated onto a substrate having concave portions, the resin composition tend to enter into the concave portions.

However, it has been found from the investigation of the present inventors that concave portions can appropriately undergo tenting provided that the viscosity of the resin composition is at least 200 cP. It has been found in particular that the resin composition with the relatively lower viscosities of 200 to 1000 cP leads to improved tenting over the concave portions, compared to the resin composition with relatively higher viscosities such as 2000 cP and 3000 cP. It has also been found that when the viscosity is adjusted to 400 to 600 cP the resin composition is particularly prevented from entering into the concave portions, thus resulting in uniform film thickness of the formed resin layer. It has also been found that even when the resin composition has a viscosity of greater than 1000 cP, tenting can be appropriately achieved provided that the aperture diameter of the concave portions is no larger than 60 μm (preferably no larger than 40 μm).

Page: 9

It is desirable that the viscosity of the resin composition be within the above-mentioned ranges when the resin composition is at the temperature at which spin coating is conducted, and the viscosity may be adjusted by appropriately increasing or decreasing the content of the solvent (b).

It is also preferred that the resin composition according to the present invention has a surface tension of 20 to 50 dyn/cm$^2$ at normal atmospheric pressure and at 20° C. Due to the resin composition having such a surface tension, the ability of the resin composition to coat the substrate having concave portions, may be improved, thereby improving both the tenting ability of the resin composition and the uniformity of the resulting resin layer. The surface tension of the resin composition can be controlled by appropriately adjusting the type and content of the solvent (b). In addition, the surface tension of the resin composition may be measured by a drop-type surface tensiometer.

Coating Method

In a second aspect, the present invention provides a coating method including the steps of allowing the above-mentioned resin composition to fall drop wise onto a substrate on which concave portions are formed and causing tenting by spin coating at a rotating speed of 300 to 4000 rpm; the steps are as follows:

Substrate

The substrate, used for the coating method according to the present invention, may be any conventional substrate having a shape suited to spin coating. Examples of the substrate include substrates for electronic parts and those on which a predetermined wiring pattern is formed. Specific examples are metal substrates such as those of silicon, silicon nitride, titanium, tantalum, palladium, titanium-tungsten, copper, chromium, iron, aluminum, gold, and nickel; glass substrates; and ceramic substrates. Copper, solder, chromium, aluminum, nickel, gold, etc. may be used for the material of the wiring, for example. In addition, concave potions are formed on the surface of the above-mentioned substrates. Examples of the pattern of the concave portion, include hole patterns such as contact holes, alignment patterns, and trench patterns between wiring. Where the term "pattern" refers to the three dimensional shape of each concave portion. The shape of the concave portions, when viewed from above, may be any shape such as a circle, ellipse, rectangle, and cross; preferably the shape is substantially circular. When the shape of the concave portions, as viewed from above, is substantially circular, spin coating of the resin composition achieves tenting and a resin layer with a uniform film thickness. Preferably, the hole diameter of the above-mentioned hole pattern is no larger than 100 μm.

Rotating Speed

In the coating method according to the present invention, conventional rotary coating devices (spin coaters) may be used as a means for applying the resin composition. It is necessary that the rotating speed of the substrate during spin coating is 300 to 4000 rpm, preferably 300 to 3000 rpm, more preferably 300 to 2000 rpm, still more preferably 300 to 1500 rpm, and particularly preferably 300 to 1000 rpm.

When a usual thick film resist is coated, spin coating is performed at a rotating speed of 500 to 1500 rpm. It is generally believed that slower rotating speeds (e.g., no greater than 500 rpm) allows the dropped resin composition to more easily enter into concave portions. Furthermore, excessively high speeds (e.g., greater than 1500 rpm) may cause problems in that the resin composition is scattered during rotation and may cause substrates to appear like cotton candy or cause the resin composition move and adheres to the under side of the substrate.

However, it has been found from the investigation of the present inventors that entry of the resin composition into the concave portions can be reduced by spin coating the resin composition at a controlled rotating speed of 300 to 4000 rpm. In this connection, preferably, the resin composition having a viscosity of no less than 200 cP and less than 2000 cP is used when the rotating speed is 300 to 1500 rpm. Consequently, the influence of centrifugal force can be suppressed during spin coating to prevent entering of the resin composition into the concave portions, and tenting can be properly performed. On the other hand, preferably, the resin composition having a viscosity of 2000 to 3000 cP is used when the rotating speed is greater than 1500 rpm to no greater than 3000 rpm. In cases where the resin composition has higher viscosities, tenting can be properly performed since drying progresses under high-speed rotation due to higher concentration of solid content.

EXAMPLES

The present invention is explained in detail with reference to examples below. However, the examples are no more than exemplification of the present invention, and in no way limit the scope of the present invention.

Preparation of Resin Composition

Examples 1 to 21 and Comparative Examples 1 to 4

Resin compositions were obtained by using the resin components (a), the solvents (b), the photosensitizing agents, and the surfactants shown in Tables 1 and 2, the viscosity of the resin composition being adjusted with the solvents (b). The abbreviated terms in Tables 1 and 2 respectively indicate the following, i.e., PM: propylene glycol monomethyl ether, γ-BLn: γ-butyrolactone, BA: butyl acetate, PGMEA: propylene glycol methyl ether acetate, EL: ethyl lactate, CH: cyclohexanone, and MIBK: methyl isobutyl ketone. In addition, viscosities were measured at 25° C. by means of an E-type viscometer.

Page: 13

The amount of surfactant added to the resin composition was based on the amount of added resin component and photosensitizing agent. In addition, surface tension was measured at 20° C. under normal atmospheric pressure by means of a drop-type surface tensiometer "TVT-2" (manufactured by Lauda Co.).

TABLE 1

|  | resin component (parts by mass) | photosensitizing agent (parts by mass) | surfactant (ppm by mass) | solvent (mass ratio) | viscosity (cP) | surface tension (dyn/cm$^2$) |
| --- | --- | --- | --- | --- | --- | --- |
| Example 1 | novolac A[1] (98) | photosensitizing agent[5] (2) | XL-121[2] (2000) | PGMEA (100) | 1000 | 30 |
| Example 2 | novolac A[1] (98) | photosensitizing agent[5] (2) | XL-121[2] (2000) | PGMEA (1000) | 600 | 29.5 |
| Example 3 | novolac A[1] (98) | photosensitizing agent[5] (2) | XL-121[2] (2000) | PGMEA (100) | 400 | 28.5 |
| Example 4 | novolac A[1] (98) | photosensitizing agent[5] (2) | XL-121[2] (2000) | PGMEA (100) | 200 | 28.0 |
| Example 5 | novolac A[1] (98) | photosensitizing agent[5] (2) | XL-121[2] (0) | PGMEA (100) | 600 | 31.5 |
| Example 6 | novolac A[1] (98) | photosensitizing agent[5] (2) | XL-121[2] (250) | PGMEA (100) | 600 | 31.3 |
| Example 7 | novolac A[1] (98) | photosensitizing agent[5] (2) | XL-121[2] (500) | PGMEA (100) | 600 | 31.2 |
| Example 8 | novolac A[1] (98) | photosensitizing agent[5] (2) | XL-121[2] (1000) | PGMEA (100) | 600 | 30.6 |
| Example 9 | novolac A[1] (98) | photosensitizing agent[5] (2) | XL-121[2] (2000) | PGMEA (100) | 600 | 29.5 |

TABLE 1-continued

|  | resin component (parts by mass) | photosensitizing agent (parts by mass) | surfactant (ppm by mass) | solvent (mass ratio) | viscosity (cP) | surface tension (dyn/cm²) |
|---|---|---|---|---|---|---|
| Example 10 | novolac A[1] (98) | photosensitizing agent[5] (2) | XL-121[2] (5000) | PGMEA (100) | 600 | 27.0 |
| Example 11 | polyhydroxystyrene[3] (98) | photosensitizing agent[5] (2) | BYK-310[4] (2000) | PGMEA (100) | 600 | 30.0 |
| Example 12 | polyhydroxystyrene[3] (98) | photosensitizing agent[5] (2) | BYK-310[4] (2000) | PGMEA/ γ-BLn (70/30) | 600 | 32.0 |
| Example 13 | polyhydroxystyrene[3] (98) | photosensitizing agent[5] (2) | BYK-310[4] (2000) | PGMEA/PM (70/30) | 600 | 30.0 |

TABLE 2

|  | resin component (parts by mass) | photosensitizing agent (parts by mass) | surfactant (ppm by mass) | solvent (mass ratio) | viscosity (cP) | surface tension (dyn/cm²) |
|---|---|---|---|---|---|---|
| Example 14 | polyhydroxystyrene[3] (98) | photosensitizing agent[5] (2) | BYK-310[4] (2000) | PGMEA/EL (70/30) | 600 | 30.5 |
| Example 15 | polyhydroxystyrene[3] (98) | photosensitizing agent[5] (2) | BYK-310[4] (2000) | PGMEA/CH (70/30) | 600 | 31.0 |
| Example 16 | novolac A[1] (98) | photosensitizing agent[5] (2) | XL-121[2] (500) | PGMEA (100) | 600 | 31.2 |
| Example 17 | novolac A[1] (98) | photosensitizing agent[5] (2) | XL-121[2] (500) | PGMEA (100) | 1000 | 31.6 |
| Example 18 | novolac A[1] (98) | photosensitizing agent[5] (2) | XL-121[2] (500) | PGMEA (100) | 1700 | 32.0 |
| Example 19 | novolac A[1] (98) | photosensitizing agent[5] (2) | XL-121[2] (500) | PGMEA (100) | 2500 | 32.7 |
| Example 20 | novolac A[1] (98) | photosensitizing agent[5] (2) | XL-121[2] (500) | PGMEA (100) | 2500 | 32.8 |
| Example 21 | novolac A[1] (98) | photosensitizing agent[5] (2) | XL-121[2] (500) | PGMEA (100) | 3000 | 33.0 |
| Comparative Example 1 | novolac A[1] (98) | photosensitizing agent[5] (2) | XL-121[2] (10000) | PGMEA (100) | 100 | 19.5 |
| Comparative Example 2 | novolac A[1] (98) | photosensitizing agent[5] (2) | XL-121[2] (2000) | PGMEA/ BA (70/30) | 100 | 26.0 |
| Comparative Example 3 | novolac A[1] (98) | photosensitizing agent[5] (2) | XL-121[2] (2000) | PGMEA/ MIBK (70/30) | 100 | 25.5 |

TABLE 2-continued

|  | resin component (parts by mass) | photosensitizing agent (parts by mass) | surfactant (ppm by mass) | solvent (mass ratio) | viscosity (cP) | surface tension (dyn/cm²) |
|---|---|---|---|---|---|---|
| Comparative Example 4 | novolac A[1] (98) | photosensitizing agent[5] (2) | XL-121[2] (2000) | PGMEA (100) | 100 | 26.5 |

Note)
1: ratio of m-cresol to p-cresol was 6:4 and mass average molecular weight was 20000;
2: silicone surfactant (manufactured by Clariant Co.);
3: mass average molecular weight 3000;
4: silicone surfactant (manufactured by Byk Co.);
5: structure of the photosensitizing agent is as follows:

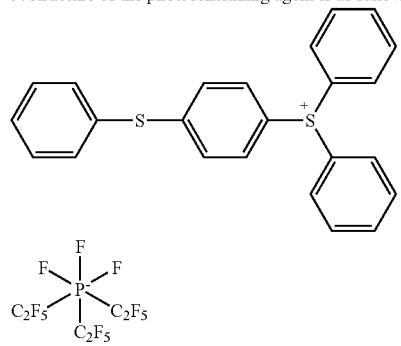

Uniformity Test of Film Thickness

The resin compositions of Examples 1 to 4 were allowed to fall drop wise onto a Cu-sputtered silicon substrate 2, having a diameter of 8 inches and a substantially cylindrical hole 1 of hole diameter 60 μm and depth 50 μm, as shown in FIG. 1, and spin coated under various rotating speeds as described in Table 2 by means of a thick film coater CS-8 (manufactured by Tokyo Ohka Kogyo Co.) thereby to form a resin layer 3 with a film thickness of 20 μm. Then heating was performed at 100° C. for 5 minutes, and the depth "a" of resins entered into the substantially cylindrical holes, and film thickness "b" of tenting resin layers were measured to obtain average values from 5 substantially cylindrical holes per substrate, i.e. 4 substantially cylindrical holes equally spaced around the outer circumference of the substrate and 1 substantially cylindrical hole in the center of the substrate. The results are shown in Table 3.

TABLE 3

|  | viscosity (cP) | rotating speed (rpm) | average depth of entered resin (μm) | average film thickness (μm) |
|---|---|---|---|---|
| Example 1 | 1000 | 1000 | 23.0 | 21.0 ± 0.8 |
| Example 2 | 600 | 600 | 12.3 | 21.1 ± 0.5 |
| Example 3 | 400 | 300 | 12.6 | 21.6 ± 0.4 |
| Example 4 | 200 | 100 | 21.5 | 19.85 ± 0.95 |

Evaluation

Figure 2:
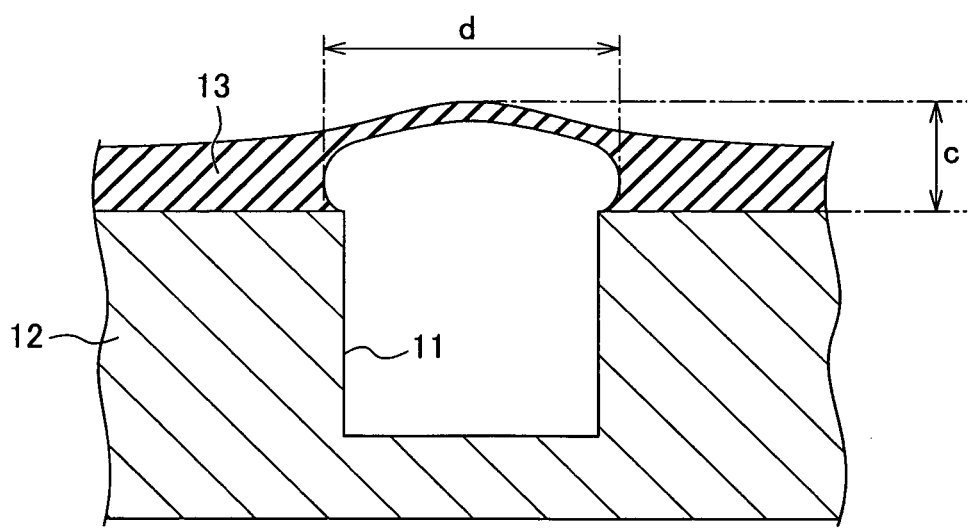
FIG. 2 is a cross-sectional view showing a state of a resin layer tenting over a substantially cylindrical hole.

Table 3 shows that the average depth of entered resins is suppressed and the film thickness of the formed resin layers becomes uniform when the viscosity of the resin composition is adjusted to at least 200 cP, in particular 400 to 600 cP. Determination of the effect of Surfactant and Resin Component The resin compositions of Examples 5 to 11 and Comparative Example 1 were allowed to fall drop wise onto an 8 inch diameter silicon substrate 12, treated with hexamethyldisilazane (HMDS), having a substantially cylindrical hole 11 of hole diameter 60 μm and depth 50 μm as shown in FIG. 2, and spin coated at a rotating speed of 500 rpm by means of the thick film coater CS-8 (manufactured by Tokyo Ohka Kogyo Co.) thereby to form a resin layer 13 with a film thickness 20 μm. Then heating was performed at 110° C. for 5 minutes, and thickness "c" and width "d" of the resin layers where tenting over the substantially cylindrical hole had occurred, were measured. Furthermore, the resin compositions were evaluated in terms of the width "d" according to the following criteria: no greater than 125 μm: A; greater than 125 μm and no greater than 130 μm: B; and greater than 130 μm: C. The results are shown in Table 4.

TABLE 4

|  | resin component | molecular weight | amount of surfactant (ppm by mass) | thickness (μm) | width (μm) | evaluation |
|---|---|---|---|---|---|---|
| Example 4 | novolac A | 20000 | 0 | 52.0 | 92.0 | A |
| Example 5 | same as above | same as above | 250 | 47.0 | 95.0 | A |
| Example 6 | same as above | same as above | 500 | 42.5 | 95.0 | A |

TABLE 4-continued

|  | resin component | molecular weight | amount of surfactant (ppm by mass) | thickness (μm) | width (μm) | evaluation |
|---|---|---|---|---|---|---|
| Example 7 | same as above | same as above | 1000 | 50.0 | 120.0 | A |
| Example 8 | same as above | same as above | 2000 | 48.8 | 121.0 | A |
| Example 9 | same as above | same as above | 5000 | 56.8 | 127.8 | B |
| Example 10 | polyhydroxystyrene | 3000 | 2000 | 52.8 | 118.7 | A |
| Comparative Example 1 | novolac A | 20000 | 10000 | 59.9 | 132.6 | C |

Evaluation

Table 4 shows that the addition of greater than 5000 ppm by mass of surfactants increases the thickness and also the width of the formed resin layers, thus causing a deterioration in the uniformity of the coated resin composition (Examples 5 to 11 and Comparative Example 1). It is therefore understood that the amount of surfactants to be added is preferably no greater than 5000 ppm by mass. It is also understood that the coating property of resin compositions is independent of the resin components used therein (Examples 9, 11).

Determination of Surface Tension

Similarly to the above-mentioned tests, the resin compositions of Examples 9, 12 to 15, and Comparative Examples 2, 3 were spin coated on substrates and the thicknesses of resin layers where tenting over the substantially cylindrical hole had occurred, were measured. Furthermore, the resin compositions were evaluated in terms of thickness according to the following criteria: no greater than 54 μm: A; and greater than 54 μm: B. The results are shown in Table 5. Table 5 also shows the surface tension of the solvents that were used. The surface tension was measured at 20° C. under normal atmospheric pressure by means of the drop-type surface tensiometer "TVT-2" (manufactured by Lauda Co.).

TABLE 5

|  | added solvent | surface tension of the solvent (dyn/cm$^2$) | thickness (μm) | evaluation |
|---|---|---|---|---|
| Example 9 | PGMEA | 27.1 | 48.8 | A |
| Example 12 | γ-BLn | 43.9 | 37.3 | A |
| Example 13 | PM | 28.0 | 52.0 | A |
| Example 14 | EL | 29.4 | 46.4 | A |
| Example 15 | CH | 33.4 | 41.7 | A |
| Comparative Example 2 | BA | 24.8 | 54.8 | B |
| Comparative Example 3 | MIBK | 23.6 | 56.4 | B |

Evaluation

Table 5 shows that the coating property of the resin compositions is enhanced by use of solvents having a surface tension of greater than 27 dyn/cm$^2$.

Determination of Tenting for Each Hole Diameter

The resin compositions of Examples 7, 16 to 21 and Comparative Example 4 were allowed to fall drop wise onto an 8 inch diameter silicon substrate, treated with hexamethyldisilazane (HMDS), having substantially cylindrical holes each with a hole diameter of 10 to 100 μm and depth of 50 μm, and spin coated at rotating speeds shown in Table 6 by means of the thick film coater CS-8 (manufactured by Tokyo Ohka Kogyo Co.). Then evaluation was performed, by a critical dimension SEM (manufactured by Hitachi, Ltd., product name: S-9220), according to the following criteria: 100% of the total number of substantially cylindrical holes achieved tenting with no resin composition entering the substantially cylindrical holes: A; no less than 50% and less than 70%: B; and less than 50%: C. Furthermore, the resin compositions were evaluated according to the following criteria: 100% of the total number of substantially cylindrical holes up to hole diameter 100 μm, achieved tenting: S; 100% of the total number of substantially cylindrical holes up to hole diameter 60 μm, achieved tenting: A; 100% of the total number of substantially cylindrical holes up to hole diameter 40 μm, achieved tenting: B; and 100% of the total number of substantially cylindrical holes up to hole diameter 20 μm, achieved tenting: D. The results are shown in Table 6.

TABLE 6

|  | rotating speed (rpm) | viscosity (cP) | hole diameter (μm) | | | | | evaluation |
|---|---|---|---|---|---|---|---|---|
|  |  |  | 10 | 20 | 40 | 60 | 100 |  |
| Example 16 | 400 | 200 | A | A | A | A | A | S |
| Example 7 | 600 | 600 | A | A | A | A | A | S |
| Example 17 | 800 | 1000 | A | A | A | A | B | A |
| Example 18 | 1200 | 1700 | A | A | A | B | C | B |
| Example 19 | 1500 | 2000 | A | A | A | B | C | B |
| Example 20 | 2000 | 2500 | A | A | A | B | C | B |
| Example 21 | 4000 | 3000 | A | A | A | C | C | B |
| Comparative Example 4 | 250 | 100 | C | C | C | C | C | D |
| Comparative Example 4 | 400 | 100 | C | C | C | C | C | D |

Evaluation

Table 6 shows that when the viscosity of the compositions is adjusted to at least 200 cP tenting over the substantially cylindrical holes can be achieved. It has been found that tenting can be achieved over a wide range of hole diameters of 10 to 100 μm when the resin composition has a viscosity of 200 to 600 cP in particular. It has also been found that a tenting rate of 100% can be achieved when the hole diameter is smaller even when the resin composition has a viscosity of 1000 to 3000 cP. On the other hand, it has been found that tenting cannot be achieved when the viscosity of the resin composition is 100 cP since the resin composition is enters the substantially cylindrical holes even when the hole diameter is 10 μm.

What is claimed is:

1. A coating method comprising the step of dropping a resin composition onto a substrate on which a pattern of concave portions is formed, and forming a resin layer covering the concave portions by spin coating at a rotating speed of 300 to 4000 rpm,
   wherein the resin composition comprises a resin component (a) and a solvent (b), and has a viscosity of at least 200 cP and wherein entrance of the resin composition into the concave portion is suppressed.

2. The coating method according to claim 1, wherein the resin composition has a surface tension of 20 to 50 dyn/cm$^2$.

3. The coating method according to claim 1, wherein the surface tension of the solvent (b) is 27 to 45 dyn/cm$^2$.

4. The coating method according to claim 1, wherein the resin composition further comprises a surfactant, wherein the concentration of the surfactant is less than 5000 ppm by mass.

5. The coating method according to claim 1, wherein the resin composition further comprises a photosensitizing agent.

6. The coating method according to claim 1, wherein the pattern of concave portions is a hole pattern.

7. The coating method according to claim 6, wherein a hole diameter of the hole pattern is no greater than 100 μm.

8. The coating method according to claim 1, wherein the spin coating results in forming the resin layer without the resin composition entering the concave portions.

* * * * *